(12) United States Patent
Parupalli et al.

(10) Patent No.: US 12,160,248 B2
(45) Date of Patent: Dec. 3, 2024

(54) SUCCESSIVE APPROXIMATION REGISTER ANALOG-TO-DIGITAL CONVERTER WITH MULTIPLE SAMPLE CAPACITORS

(71) Applicant: Cirrus Logic International Semiconductor Ltd., Edinburgh (GB)

(72) Inventors: Vamsikrishna Parupalli, Austin, TX (US); Mikel Ash, Austin, TX (US); Jianping Wen, Austin, TX (US); Melvin L. Hagge, Round Rock, TX (US)

(73) Assignee: Cirrus Logic Inc., Austin, TX (US)

( * ) Notice: Subject to any disclaimer, the term of this patent is extended or adjusted under 35 U.S.C. 154(b) by 161 days.

(21) Appl. No.: 18/098,544

(22) Filed: Jan. 18, 2023

(65) Prior Publication Data

US 2024/0187016 A1 Jun. 6, 2024

Related U.S. Application Data

(60) Provisional application No. 63/430,422, filed on Dec. 6, 2022.

(51) Int. Cl.
*H03M 1/46* (2006.01)
*H03M 1/80* (2006.01)

(52) U.S. Cl.
CPC .......... *H03M 1/466* (2013.01); *H03M 1/468* (2013.01); *H03M 1/804* (2013.01)

(58) Field of Classification Search
CPC ....... H03M 1/466; H03M 1/468; H03M 1/804
USPC ................................................ 341/161, 172
See application file for complete search history.

(56) References Cited

U.S. PATENT DOCUMENTS

| 6,448,911 | B1 | 9/2002 | Somayajula |
| 7,015,841 | B2 * | 3/2006 | Yoshida .............. H03M 1/1245 341/172 |
| 7,965,218 | B2 | 6/2011 | Ohnhaeuser et al. |
| 8,441,386 | B2 | 5/2013 | Strode |

(Continued)

FOREIGN PATENT DOCUMENTS

WO 9639747 A1 12/1996

OTHER PUBLICATIONS

Combined Search and Examination Report, United Kingdom Intellectual Property Office, Application No. GB2103292.5, mailed Aug. 2, 2021.

*Primary Examiner* — Khai M Nguyen
(74) *Attorney, Agent, or Firm* — Jackson Walker L.L.P.

(57) ABSTRACT

A SAR ADC may include a plurality of capacitor networks, wherein each capacitor network of a plurality of capacitor networks has a plurality of sampling capacitors for sampling over a plurality of sampling sub-phases an analog input signal to the SAR ADC and at least one non-sampling capacitor. The SAR ADC may also include a DAC comprising a plurality of sub-DACs including at least a first sub-DAC representing most significant bits of an output of the SAR ADC, wherein the output of the first sub-DAC is coupled to the sampling capacitors of the plurality of capacitor networks and a second sub-DAC representing bits of the output of the SAR ADC lesser in magnitude significance than those of the first sub-DAC, wherein the output of the second sub-DAC is coupled to a respective one of at least one non-sampling capacitor of each of the plurality of capacitor networks.

24 Claims, 4 Drawing Sheets

(56) References Cited

U.S. PATENT DOCUMENTS

| | | | |
|---|---|---|---|
| 8,952,839 B2 * | 2/2015 | Wang | H03M 1/38 |
| | | | 341/161 |
| 9,071,265 B1 | 6/2015 | Dey et al. | |
| 9,490,832 B1 | 11/2016 | Zhou et al. | |
| 10,148,280 B2 | 12/2018 | Lee et al. | |
| 10,218,376 B1 | 2/2019 | Collins et al. | |
| 10,218,377 B2 | 2/2019 | Bogner | |
| 10,277,243 B2 | 4/2019 | Kim et al. | |
| 10,432,213 B1 | 10/2019 | Aboudina et al. | |
| 10,447,291 B1 * | 10/2019 | Thomas | H03M 1/1245 |
| 10,951,225 B1 | 3/2021 | Shannon et al. | |
| 2010/0026546 A1 | 2/2010 | Ohnhaeuser | |
| 2013/0044015 A1 | 2/2013 | Reinhold et al. | |
| 2018/0183457 A1 | 6/2018 | Lee et al. | |
| 2020/0228132 A1 | 7/2020 | Huang | |

* cited by examiner

SUCCESSIVE APPROXIMATION REGISTER ANALOG-TO-DIGITAL CONVERTER WITH MULTIPLE SAMPLE CAPACITORS

RELATED APPLICATION

The present disclosure is related to U.S. Pat. No. 10,951,225, which is incorporated herein by reference in its entirety. In addition, the present disclosure claims priority to U.S. Provisional Pat. Appl. No. 63/430,422, filed Dec. 6, 2022, which is incorporated herein by reference in its entirety.

FIELD OF DISCLOSURE

The present disclosure relates in general to signal processing systems, and more particularly, to a successive approximation register analog-to-digital converter (SAR ADC) with multiple sample capacitors.

BACKGROUND

A SAR ADC is a type of analog-to-digital converter that converts an analog waveform into a discrete digital representation via a binary search through all possible quantization levels of the digital output of the SAR ADC before finally converging upon a digital output for each conversion. Although SAR ADCs are widely used to convert an analog electrical signal (e.g., such as that generated by an analog sensor) into a digital equivalent signal, approaches are desired for implementing SAR ADCs to maximize sampling times and to minimize the sizes of electrical components (e.g., sampling capacitors) of SAR ADCs.

SAR ADCs may be used to sample a single input or multiple inputs by time interleaving or time-division multiplexing. Time interleaving/time-division multiplexing may be performed by using the same sampling network to sample different channels or by using different sampling networks for each of a plurality of channels. Using different sampling networks for each of a plurality of different channels may maximize inter-channel isolation and may simplify an analog front end settling requirement by providing additional time for an input to the SAR ADC to settle.

With a SAR ADC sampling rate distributed among a plurality of different channels, each channel's effective sampling rate may be reduced. An anti-alias filter requirement for a channel may be set by its effective sample rate. A lower sample rate may require a low-pass filter with a lower bandwidth. However, in order to achieve filter characteristics to have lower bandwidth for anti-aliasing while maintaining a flat gain response in the signal bandwidth, a higher-order filter with a large integrated circuit area may be required.

SUMMARY

In accordance with the teachings of the present disclosure, certain disadvantages and problems associated with implementation of SAR ADCs may be reduced or eliminated.

In accordance with embodiments of the present disclosure, a SAR ADC may include a plurality of capacitor networks, wherein each capacitor network of the plurality of capacitor networks has a plurality of sampling capacitors including at least a first sampling capacitor and a second sampling capacitor for sampling an analog input signal to the SAR ADC and at least one non-sampling capacitor. The SAR ADC may also include a digital-to-analog converter (DAC) comprising a plurality of sub-DACs including at least a first sub-DAC representing most significant bits of an output of the SAR ADC, wherein the output of the first sub-DAC is coupled to the plurality of sampling capacitors of each of the plurality of capacitor networks and a second sub-DAC representing bits of the output of the SAR ADC lesser in magnitude significance than those of the first sub-DAC, wherein the output of the second sub-DAC is coupled to a respective one of at least one non-sampling capacitor of each of the plurality of capacitor networks. The SAR ADC may further include an analog comparator configured to compare a sampled analog input signal of the SAR ADC to an output of the DAC and a successive approximation register (SAR) configured to, responsive to an output of the analog comparator, communicate to the DAC successive approximations of a digital code corresponding to the sampled analog input signal. Each particular capacitor network of the plurality of capacitor networks may be configured to operate in a plurality of phases comprising a sampling phase and a conversion phase. In the sampling phase, the particular capacitor network is decoupled from the DAC and samples the analog input signal using its respective plurality of sampling capacitors in a plurality of sampling sub-phases comprising a first sampling sub-phase in which the first sampling capacitor samples the analog input and a second sampling sub-phase in which the second sampling capacitor samples the analog input.

In accordance with these and other embodiments of the present disclosure, a method may be provided for use in a SAR ADC having a plurality of capacitor networks, wherein each capacitor network of the plurality of capacitor networks has a plurality of sampling capacitors including at least a first sampling capacitor and a second sampling capacitor for sampling an analog input signal to the SAR ADC and at least one non-sampling capacitor.

The method may include sampling, with each sampling capacitor, an analog input signal to the SAR ADC and comparing the sampled analog input signal of the SAR ADC to an output of a digital-to-analog converter (DAC), wherein the DAC comprises a plurality of sub-DACs including at least a first sub-DAC representing most significant bits of an output of the SAR ADC, wherein the output of the first sub-DAC is coupled to the plurality of sampling capacitors of each of the plurality of capacitor networks and a second sub-DAC representing bits of the output of the SAR ADC lesser in magnitude significance than those of the first sub-DAC, wherein the output of the second sub-DAC is coupled to a respective one of at least one non-sampling capacitor of each of the plurality of capacitor networks.

The method may also include responsive to comparing the sampled analog input signal to the output of the DAC, communicating, with a successive approximation register (SAR) to the DAC successive approximations of a digital code corresponding to the sampled analog input signal and operating each particular capacitor network of the plurality of capacitor networks in a plurality of phases comprising a sampling phase and a conversion phase. In the sampling phase, the particular capacitor network is decoupled from the DAC and samples the analog input signal using its respective plurality of sampling capacitors in a plurality of sampling sub-phases comprising a first sampling sub-phase in which the first sampling capacitor samples the analog input and a second sampling sub-phase in which the second sampling capacitor samples the analog input. In the conversion phase, the particular capacitor is coupled to the DAC and converts, using successive approximation, a sampled analog input signal sampled during the sampling phase into an equivalent digital output signal.

In accordance with these and other embodiments of the present disclosure, a system may include an analog front end configured to generate an analog input signal and a SAR ADC configured to convert the analog input signal to an equivalent digital signal. The SAR ADC may include a plurality of capacitor networks, wherein each capacitor network of the plurality of capacitor networks has a plurality of sampling capacitors including at least a first sampling capacitor and a second sampling capacitor for sampling an analog input signal to the SAR ADC and at least one non-sampling capacitor. The SAR ADC may also include a digital-to-analog converter (DAC) comprising a plurality of sub-DACs including at least a first sub-DAC representing most significant bits of an output of the SAR ADC, wherein the output of the first sub-DAC is coupled to the plurality of sampling capacitors of each of the plurality of capacitor networks and a second sub-DAC representing bits of the output of the SAR ADC lesser in magnitude significance than those of the first sub-DAC, wherein the output of the second sub-DAC is coupled to a respective one of at least one non-sampling capacitor of each of the plurality of capacitor networks. The SAR ADC may further include an analog comparator configured to compare a sampled analog input signal of the SAR ADC to an output of the DAC and a successive approximation register (SAR) configured to, responsive to an output of the analog comparator, communicate to the DAC successive approximations of a digital code corresponding to the sampled analog input signal. Each particular capacitor network of the plurality of capacitor networks may be configured to operate in a plurality of phases comprising a sampling phase and a conversion phase. In the sampling phase, the particular capacitor network is decoupled from the DAC and samples the analog input signal using its respective plurality of sampling capacitors in a plurality of sampling sub-phases comprising a first sampling sub-phase in which the first sampling capacitor samples the analog input and a second sampling sub-phase in which the second sampling capacitor samples the analog input.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
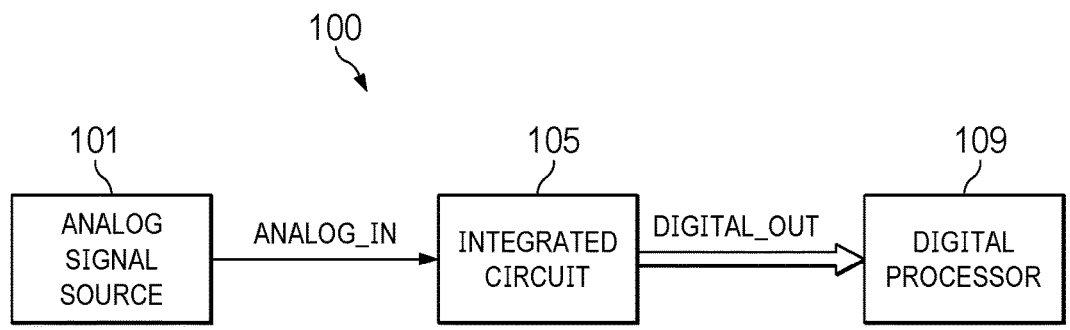
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include an analog signal source 101, an integrated circuit (IC) 105, and a digital processor 109. Analog signal source 101 may comprise any system, device, or apparatus configured to generate an analog electrical signal, for example an analog input signal ANALOG_IN. For example, in embodiments in which signal processing system 100 is a processing system, analog signal source 101 may comprise a microphone transducer.

Integrated circuit 105 may comprise any suitable system, device, or apparatus configured to process analog input signal ANALOG_IN to generate a digital output signal DIGITAL_OUT and condition digital output signal DIGITAL_OUT for transmission over a bus to digital processor 109. Once converted to digital output signal DIGITAL_OUT, the signal may be transmitted over significantly longer distances without being susceptible to noise as compared to an analog transmission over the same distance. In some embodiments, integrated circuit 105 may be disposed in close proximity with analog signal source 101 to ensure that the length of the analog line between analog signal source 101 and integrated circuit 105 is relatively short to minimize the amount of noise that can be picked up on an analog output line carrying analog input signal ANALOG_IN. For example, in some embodiments, analog signal source 101 and integrated circuit 105 may be formed on the same substrate. In other embodiments, analog signal source 101 and integrated circuit 105 may be formed on different substrates packaged within the same integrated circuit package.

Digital processor 109 may comprise any suitable system, device, or apparatus configured to process a digital output signal for use in a digital system. For example, digital processor 109 may comprise a microprocessor, microcontroller, digital signal processor (DSP), application specific integrated circuit (ASIC), or any other device configured to interpret and/or execute program instructions and/or process data, such as digital output signal DIGITAL_OUT.

Signal processing system 100 may be used in any application in which it is desired to process an analog signal to generate a digital signal. Thus, in some embodiments, signal processing system 100 may be integral to an audio device that converts analog signals (e.g., from a microphone) to digital signals representing the sound incident on a microphone. As another example, signal processing system 100 may be integral to a radio-frequency device (e.g., a mobile telephone) to convert radio-frequency analog signals into digital signals.

Figure 2:
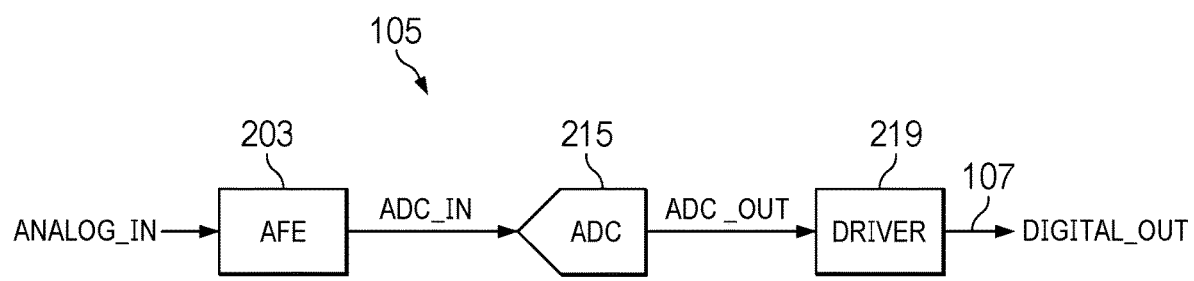
FIG. 2 illustrates a block diagram of selected components of an integrated circuit for processing an analog signal to generate a digital signal, in accordance with embodiments of the present disclosure.

FIG. 2 illustrates a block diagram of selected components of integrated circuit 105, in accordance with embodiments of the present disclosure. As shown in FIG. 2, integrated circuit 105 may include a processing path having a respective analog front end (AFE) 203, an ADC 215, and a driver 219. AFE 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. An example of signal ANALOG_IN may be an analog electrical signal generated by an electronic sensor (e.g., a microphone, a temperature sensor, a positional sensor, etc.). AFE 203 may generate an ADC input signal ADC_IN which may be communicated to ADC 215 on one or more output lines.

ADC 215 may comprise any suitable system, device, or apparatus configured to convert an analog ADC input signal ADC_IN received at its input, to a digital signal ADC_OUT representative of analog input signal ANALOG_IN. ADC 215 may itself include one or more components (e.g., delta-sigma modulator, decimator, etc.) for carrying out the functionality of ADC 215. In some embodiments, ADC 215 may comprise a SAR ADC. Selected components for the example embodiments of ADC 215 are discussed in greater detail below with respect to FIGS. 3 and 4.

Driver 219 may receive the digital signal ADC_OUT output by ADC 215 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital output signal DIGITAL_OUT for transmission over a bus to digital processor 109. In FIG. 2, the bus receiving digital output signal DIGITAL_OUT is shown as single-ended. In some embodiments, driver 219 may generate a differential digital output signal 107.

Figure 3:
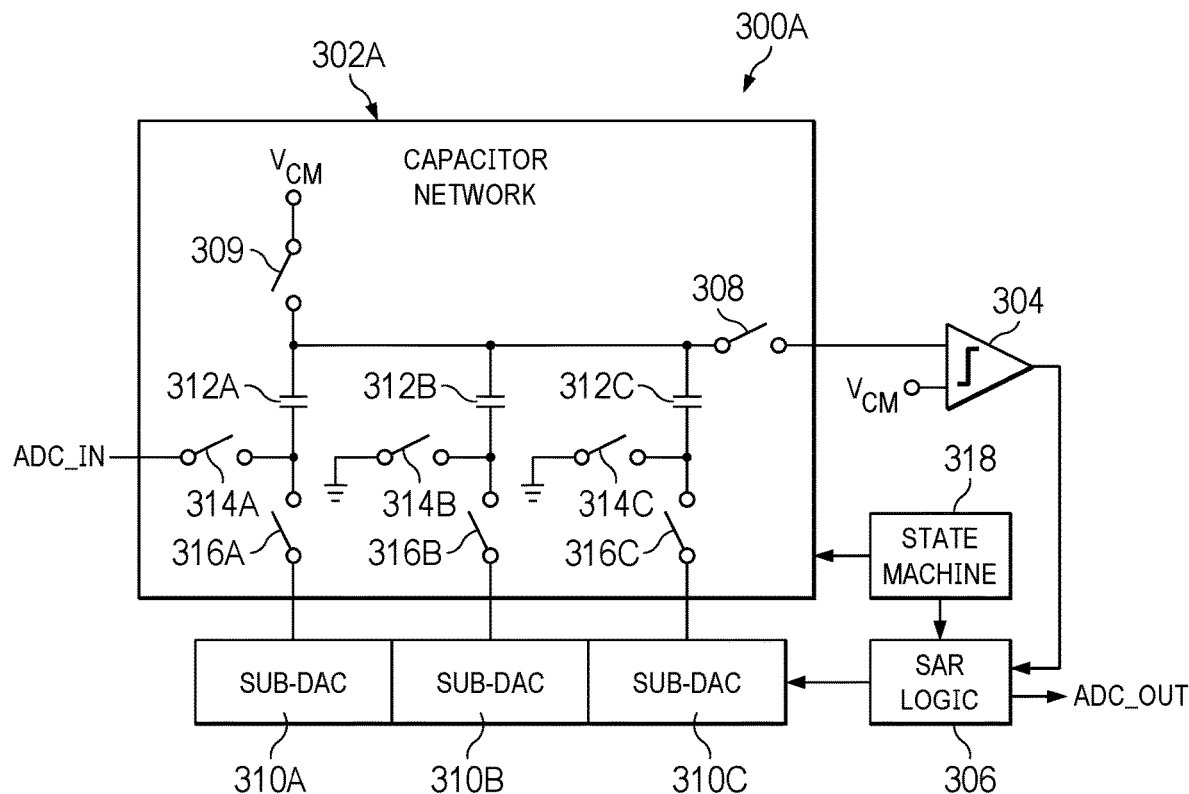
FIG. 3 illustrates a block diagram of selected components of an example SAR ADC, in accordance with embodiments of the present disclosure.

FIG. 3 illustrates a block diagram of selected components of an example SAR ADC 300A, in accordance with embodiments of the present disclosure. In some embodiments. SAR ADC 300A may be used to implement ADC 215 shown in FIG. 2. As shown in FIG. 3, SAR ADC 300A may include an internal reference digital-to-analog converter (DAC) implemented by capacitor network 302A and a plurality of sub-DACs 310 (e.g., sub-DACs 310A, 310B, and 310C). SAR ADC 300A may also include an analog comparator 304, a SAR logic 306, and a state machine 318.

As shown in FIG. 3, capacitor network 302A may comprise a plurality of capacitors 312 (e.g., 312A, 312B, and 312C). Each capacitor 312 may be coupled at its first terminal to a respective sub-DAC 310 via a respective conversion switch 316 (e.g., 316A, 316B, and 316C). The second terminal of each capacitor 312 may be coupled to the input of comparator 304 by a conversion switch 308 and may further be coupled to a common-mode or reference voltage $V_{CM}$ via a sampling switch 309.

Capacitor 312A of capacitor network 302A may operate as a sampling capacitor, and thus may be coupled at its first terminal to analog ADC input signal ADC_IN via a sampling switch 314A. Capacitors 312 (e.g., 312B, 312C) other than sampling capacitor 312A may be coupled to a ground voltage via respective sampling switches 314 (e.g., 314B and 314C). Each non-sampling capacitor 312 (e.g., 312B, 312C) may be smaller in capacitance than sampling capacitor 312A but may be matched in physical layout to sampling capacitor 312A. In turn, each non-sampling capacitor 312 may be different in capacitance. In some embodiments, the various capacitances of capacitors 312 may be integer ratios of one another, with such ratios based on the magnitude significance of bits of the respective sub-DAC 310 to which such a capacitor 312 is coupled.

SAR ADC 300A may operate at a sampling frequency $F_S$ in which for each sampling period, SAR ADC 300A performs a sampling phase and a conversion phase. In a sampling phase of SAR ADC 300A, capacitor network 302A may serve as a sample-and-hold circuit to acquire analog ADC input voltage ADC_IN. For example, in the sampling phase, state machine 318 may enable (e.g., activate, turn on) sampling switches 314 and 309 and may disable conversion switches 316 to sample analog ADC input voltage ADC_IN and provide such sampled analog ADC input voltage ADC_IN to comparator 304.

Analog comparator 304 may, during a conversion phase of SAR ADC 300A, compare an analog signal equivalent to a digital code representing an approximation generated by SAR logic 306 to a fixed reference voltage $V_{CM}$ at each of successive approximations of SAR logic 306. In turn, as is known in the art, SAR logic 306 may, during the conversion phase and responsive to the output of analog comparator 304, provide to the internal DAC successive approximations of a digital code corresponding to sampled analog ADC input voltage ADC_IN, ultimately resulting in SAR logic 306 generating digital ADC output signal ADC_OUT corresponding to sampled analog ADC input voltage ADC_IN.

Notably, for purposes of ease and clarity of exposition, SAR ADC 300A is shown in a single-ended implementation. In practice, SAR ADC 300A may be implemented to have a differential input and differential output from two instances of capacitor network 302A. In such an implementation, these two differential outputs may serve as the inputs to comparator 304 (e.g., instead of one input of comparator 304 receiving fixed reference voltage $V_{CM}$ as shown in FIG. 3).

In the conversion phase, the internal DAC implemented by sub-DACs 310 and capacitor network 302A may generate an analog signal equivalent to a digital code representing an approximation generated by SAR logic 306, and communicate such analog signal to comparator 304 for comparison to sampled analog ADC input voltage ADC_IN.

In operation during the conversion phase, switches 308, 316A, 316B, and 316C may be enabled, and switches 314A, 314B, 314C, and 309 may be disabled. In a first conversion sub-phase, successive approximations may be generated for the bits of sub-DAC 310A which may be more significant than the bits of sub-DACs 310B and 310C. In a second conversion sub-phase, successive approximations may be generated for bits of sub-DAC 310B which may be more significant than the bits of sub-DAC 310C. In a third conversion sub-phase, successive approximations may be generated for bits of sub-DAC 310C. After completion of the third conversion sub-phase, the approximation of SAR logic 306 may represent sampled analog ADC input signal ADC_IN, and SAR ADC 300A may generate digital ADC output signal ADC_OUT.

Although FIG. 3 depicts the internal DAC having three sub-DACs 310 and respective capacitors 312, it is understood that such internal DAC may include any suitable number of two or more sub-DACs 310 and respective capacitors 312, with a number of conversion sub-phases equal to such number of sub-DACs 310 and respective capacitors 312.

Figure 4:
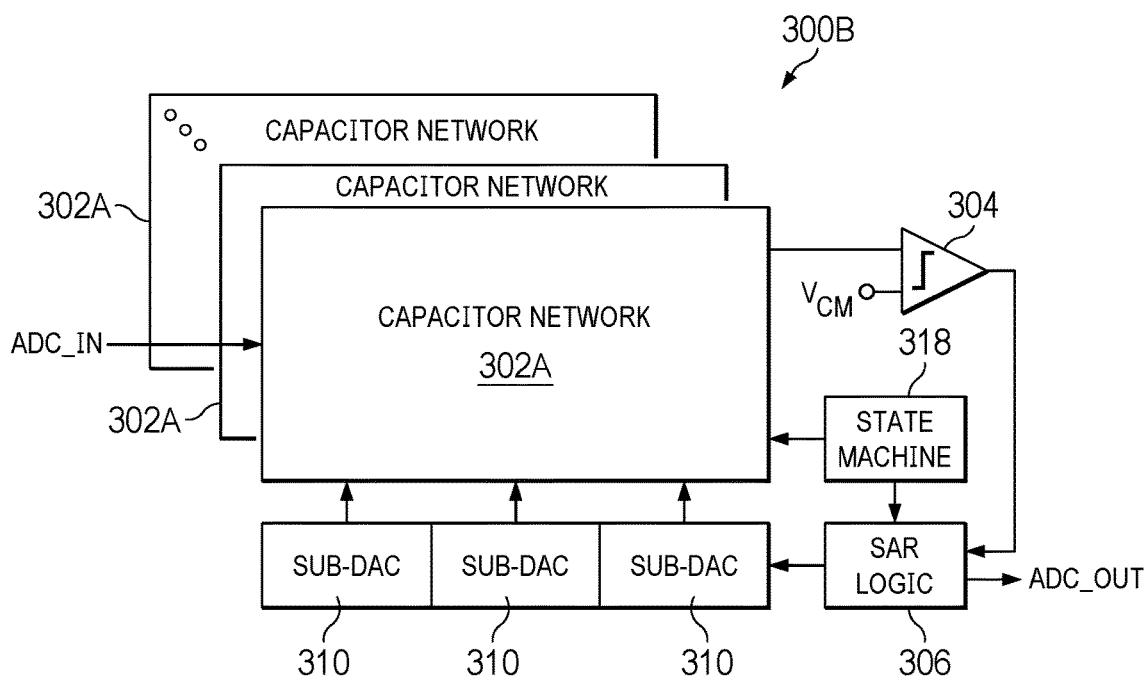
FIG. 4 illustrates a block diagram of selected components of an example SAR ADC having a plurality of sampling network channels, in accordance with embodiments of the present disclosure.

FIG. 4 illustrates a block diagram of selected components of an example SAR ADC 300B having a plurality of sampling network channels, in accordance with embodiments of the present disclosure. In some embodiments, SAR ADC 300B may be used to implement ADC 215 shown in FIG. 2. Further, SAR ADC 300B shown in FIG. 4 may be similar in many respects to SAR ADC 300A of FIG. 3, and thus, only certain differences between SAR ADC 300B and SAR ADC 300A are discussed below.

In particular, one difference between SAR ADC 300B and SAR ADC 300A is that SAR ADC 300B includes a plurality of capacitor networks 302 each coupled to sub-DACs 310, analog comparator 304, and state machine 318 in a similar manner to that of the single capacitor network 302A of SAR ADC 300A. Accordingly, SAR ADC 300B may, under the control of state machine 318, be operable to operate in a time-division multiplexed manner in which one capacitor network 302A may operate in a sampling phase while another capacitor network operates in a conversion phase, thus maximizing sampling and conversion time. The ADC architecture of FIG. 4, which uses DAC 310 to drive sampling capacitors 312A, may allow for smaller sizes for sampling capacitors 312A, which in turn may reduce the electrical driving requirements of AFE 203. Furthermore, the architecture of SAR ADC 300B permits multiple capacitor networks 302 to leverage a single analog comparator 304, single state machine 318, single SAR logic 306, and a single DAC comprising sub-DACs 310, thus minimizing duplication of components needed to perform time-division multiplexed operation and simultaneous sampling and conversion.

Despite the advantages of SAR ADC 300B, SAR ADC 300B using capacitor network 302A may suffer from one or more of the disadvantages described in the Background section. The speed of data conversion of SAR ADC 300B may be limited by conversion time and not by sampling time. In the time-multiplexed SAR ADC 300B with distributed sampling, the conversion time per channel may be much smaller than the non-conversion time (e.g., time for sampling and/or tracking input).

Figure 5:
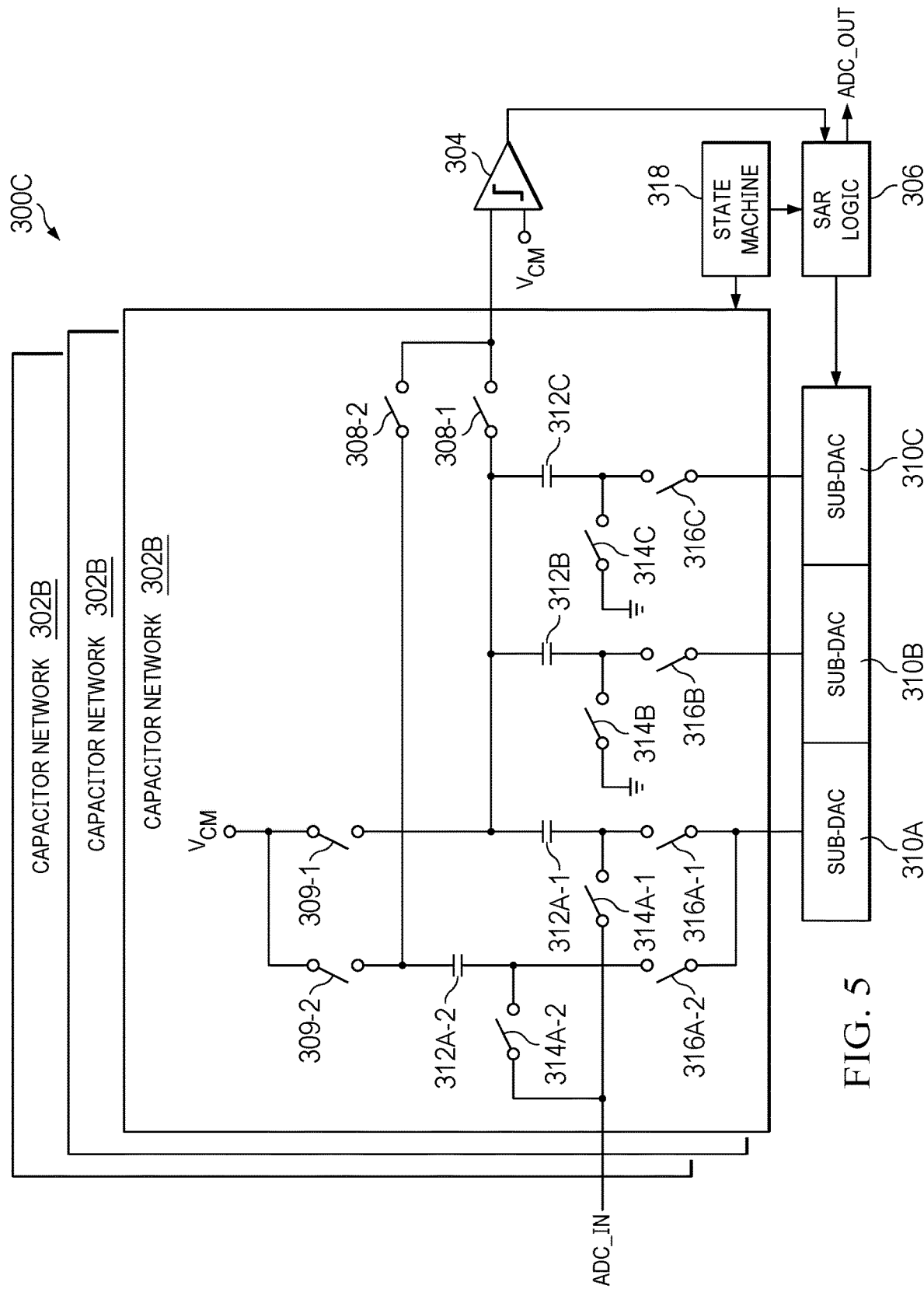
FIG. 5 illustrates a block diagram of selected components of an example SAR ADC having a plurality of sampling network channels with multiphase sampling, in accordance with embodiments of the present disclosure.

FIG. 5 illustrates a block diagram of selected components of an example SAR ADC 300C having a plurality of sampling network channels with multiphase sampling, in accordance with embodiments of the present disclosure. In some embodiments. SAR ADC 300C may be used to implement ADC 215 shown in FIG. 2. Further, SAR ADC 300C shown in FIG. 5 may be similar in many respects to SAR ADC 300B of FIG. 4, and thus, only certain differences between SAR ADC 300C and SAR ADC 300B are discussed below. In particular, SAR ADC 300C may include a plurality of capacitor networks 302B in lieu of capacitor networks 302A. Further, each capacitor network 302B shown in FIG. 5 may be similar in many respects to capacitor network 302A of FIG. 3, and thus, only certain differences between capacitor network 302B and capacitor network 302A are discussed below.

One particular difference between capacitor network 302A and capacitor network 302B is that in capacitor network 302B: (a) sampling capacitor 312A of capacitor network 302A may be split into two sampling capacitors 312A-1 and 312A-2 (wherein each sampling capacitor 312A-1 and 312A-2 may have half the capacitance of sampling capacitor 312A); (b) sampling switch 314A of capacitor network 302A may be split into two sampling switches 314A-1 and 314A-2; (c) conversion switch 316A of capacitor network 302A may be split into two conversion switches 316A-1 and 316A-2; (d) sampling switch 309 of capacitor network 302A may be split into two sampling switches 309-1 and 309-2; and (e) conversion switch 308 may be split into two conversion switches comprising a conversion switch 308-1 and conversion switch 308-2, such that the second terminal of each capacitor 312 may be coupled to the input of comparator 304 by conversion switch 308-1 and such that conversion switch 308-2 may be coupled between the input of comparator 304 and an electrical node shared by sampling switch 309-2 and capacitor 312A-2, as shown in FIG. 5.

Figure 6:
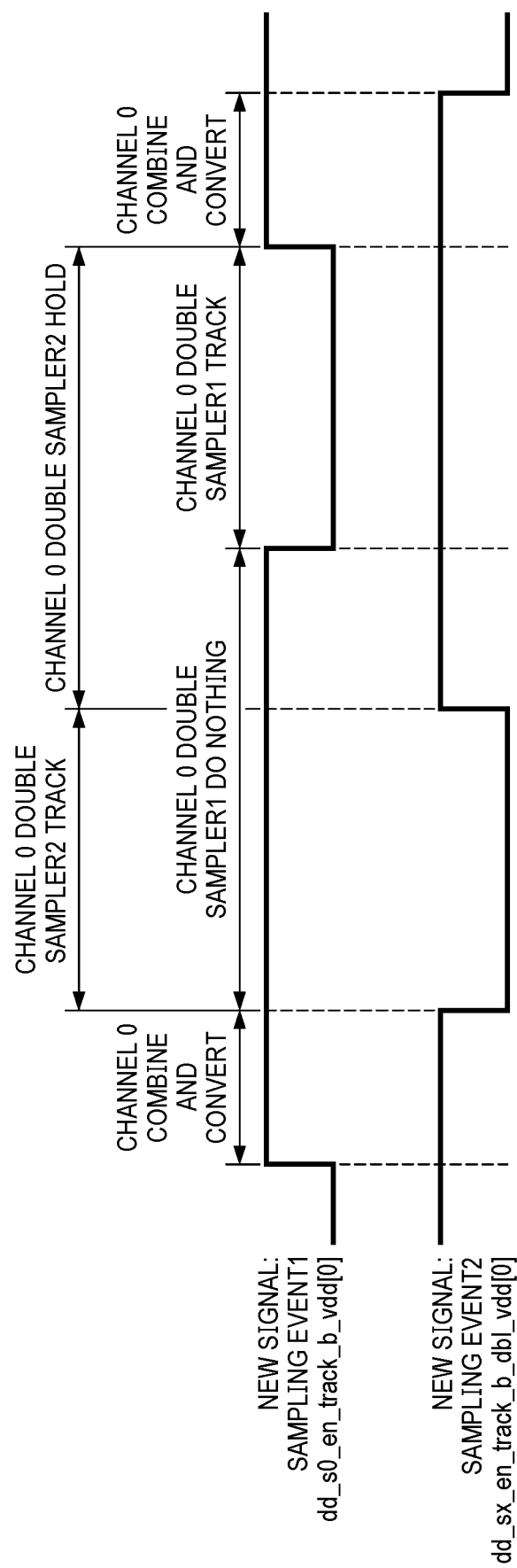
FIG. 6 illustrates a timing diagram of operation of a capacitor network shown in FIG. 5, in accordance with embodiments of the present disclosure.

With the architecture of capacitor network 302B, sampling capacitor 312A is essentially split into two banks wherein each bank performs a uniform sampling in time during a sampling phase. Accordingly, each sample of analog ADC input signal ADC_IN may be sampled twice by capacitor network 302B prior to conversion, as shown in the timing diagram depicted in FIG. 6, thus effectively doubling the sampling rate to two times the sampling rate ($2F_S$) compared to the architecture of capacitor network 302A, in order to satisfy anti-aliasing requirements. With an anti-aliasing filter pole set at $F_S/2$, the higher effective sampling rate of $2F_S$ may provide for better attenuation at fold back frequencies, compared to the single sample/conversion architecture of capacitor network 302A. During the conversion phase, both sampling capacitors 312A-1 and 312A-2 may be combined and charge shared, resulting in a data rate of $F_S$ for each channel of SAR ADC 300C. The combining of charges between sampling capacitors 312A-1 and 312A-2 may also create a notch in amplitude response at sampling frequency $F_S$.

Thus, the architecture of capacitor network 302B may enable a time-division multiplexed SAR ADC with a distributed sampling system comprising a capacitor network for each of a plurality of signal channels. In operation, each analog input sample may be sampled multiple times before conversion onto sampling capacitors of the capacitor network, and the SAR conversion is performed on the combined sampling capacitor of each channel.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A successive approximation register analog-to-digital converter (SAR ADC) comprising:
    a capacitor network comprising a plurality of sampling capacitors including at least a first sampling capacitor and a second sampling capacitor for sampling an analog input signal to the SAR ADC and at least one non-sampling capacitor;
    a digital-to-analog converter (DAC);
    an analog comparator configured to compare a sampled analog input signal of the SAR ADC to an output of the DAC; and
    a successive approximation register (SAR) configured to, responsive to an output of the analog comparator, communicate to the DAC successive approximations of a digital code corresponding to the sampled analog input signal;
    wherein the capacitor network is configured to operate in a plurality of phases comprising:
        a sampling phase in which the capacitor network samples the analog input signal using the plurality of sampling capacitors in a plurality of sampling sub-phases comprising:
            a first sampling sub-phase in which the first sampling capacitor samples the analog input; and
            a second sampling sub-phase in which the second sampling capacitor samples the analog input; and
        a conversion phase in which the first sampling capacitor and the second sampling capacitor are combined and charge shared and in which the capacitor network converts, using successive approximation, a sampled analog input signal sampled during the sampling phase into an equivalent digital output signal.

2. The SAR ADC of claim 1, wherein a first capacitance of either of the first sampling capacitor and the second sampling capacitor is significantly greater than a second capacitance of the non-sampling capacitor.

3. The SAR ADC of claim 1, wherein:
    the SAR ADC further comprises a plurality of capacitor networks comprising at least the capacitor network and a second capacitor network wherein the second capacitor network comprises a second plurality of sampling capacitors including at least a third sampling capacitor and a fourth sampling capacitor for sampling the analog input signal to the SAR ADC and at least one second non-sampling capacitor; and
    the second capacitor network is configured to operate in its own respective plurality of phases comprising:
        a sampling phase in which the second capacitor network samples the analog input signal using the second plurality of sampling capacitors in a plurality of sampling sub-phases comprising:
            a first sampling sub-phase in which the first sampling capacitor of the second capacitor network samples the analog input; and
            a second sampling sub-phase in which the second sampling capacitor of the second capacitor network samples the analog input; and
        a conversion phase in which the first sampling capacitor of the second capacitor network and the second sampling capacitor of the second capacitor network are combined and charge shared and in which the second capacitor network converts, using successive approximation, a second sampled analog input signal sampled during the sampling phase into a second equivalent digital output signal.

4. The SAR ADC of claim 3, wherein the SAR ADC is configured to operate such that the capacitor network is able to operate in the sampling phase of the capacitor network contemporaneously with the second capacitor network operating in the conversion phase of the second capacitor network.

5. The SAR ADC of claim 1, wherein the DAC comprises a plurality of sub-DACs including at least:
    a first sub-DAC representing most significant bits of an output of the SAR ADC, wherein the output of the first sub-DAC is coupled to the plurality of sampling capacitors of each of the plurality of capacitor networks; and
    a second sub-DAC representing bits of the output of the SAR ADC lesser in magnitude significance than those of the first sub-DAC, wherein the output of the second sub-DAC is coupled to a respective one of at least one non-sampling capacitor of each of the plurality of capacitor networks.

6. The SAR ADC of claim 5, wherein the capacitor network is configured to operate, while in the conversion phase, in a plurality of sub-phases comprising:
    a first conversion sub-phase in which the output of the first sub-DAC is coupled to the plurality of sampling capacitors of the capacitor network, and wherein successive approximation for bits of the first sub-DAC is performed; and
    a second conversion sub-phase in which the output of the second sub-DAC is coupled to the non-sampling capacitor of the capacitor network, and wherein successive approximation for bits of the second sub-DAC is performed.

7. The SAR ADC of claim 1, wherein the capacitor network is decoupled from the DAC during the sampling phase.

8. The SAR ADC of claim 1, wherein the capacitor network is coupled to the DAC during the conversion phase.

9. A method comprising, in a successive approximation register analog-to-digital converter (SAR ADC) having a capacitor network comprising a plurality of sampling capacitors including at least a first sampling capacitor and a second sampling capacitor for sampling an analog input signal to the SAR ADC and at least one non-sampling capacitor:
  sampling, with the plurality of sampling capacitors, an analog input signal to the SAR ADC;
  comparing the sampled analog input signal of the SAR ADC to an output of a digital-to-analog converter (DAC);
  responsive to comparing the sampled analog input signal to the output of the DAC, communicating, with a successive approximation register (SAR) to the DAC successive approximations of a digital code corresponding to the sampled analog input signal; and
  operating the capacitor network in a plurality of phases comprising:
    a sampling phase in which the capacitor network samples the analog input signal using the plurality of sampling capacitors in a plurality of sampling sub-phases comprising:
      a first sampling sub-phase in which the first sampling capacitor samples the analog input; and
      a second sampling sub-phase in which the second sampling capacitor samples the analog input; and
    a conversion phase in which the first sampling capacitor and the second sampling capacitor are combined and charge shared and in which the capacitor network converts, using successive approximation, a sampled analog input signal sampled during the sampling phase into an equivalent digital output signal.

10. The method of claim 9, wherein a first capacitance of either of the first sampling capacitor and the second sampling capacitor is significantly greater than a second capacitance of the non-sampling capacitor.

11. The method of claim 9, wherein:
  the SAR ADC further comprises a plurality of capacitor networks comprising at least the capacitor network and a second capacitor network wherein the second capacitor network comprises a second plurality of sampling capacitors including at least a third sampling capacitor and a fourth sampling capacitor for sampling the analog input signal to the SAR ADC and at least one second non-sampling capacitor; and
  the method further comprises operating the second capacitor network in its own respective plurality of phases comprising:
    a sampling phase in which the second capacitor network samples the analog input signal using the second plurality of sampling capacitors in a plurality of sampling sub-phases comprising:
      a first sampling sub-phase in which the first sampling capacitor of the second capacitor network samples the analog input; and
      a second sampling sub-phase in which the second sampling capacitor of the second capacitor network samples the analog input; and
    a conversion phase in which the first sampling capacitor of the second capacitor network and the second sampling capacitor of the second capacitor network are combined and charge shared and in which the second capacitor network converts, using successive approximation, a second sampled analog input signal sampled during the sampling phase into a second equivalent digital output signal.

12. The method of claim 11, further comprising operating the SAR ADC such that the capacitor network is able to operate in the sampling phase of the capacitor network contemporaneously with the second capacitor network operating in the conversion phase of the second capacitor network.

13. The method of claim 9, wherein the DAC comprises a plurality of sub-DACs including at least:
  a first sub-DAC representing most significant bits of an output of the SAR ADC, wherein the output of the first sub-DAC is coupled to the plurality of sampling capacitors of each of the plurality of capacitor networks; and
  a second sub-DAC representing bits of the output of the SAR ADC lesser in magnitude significance than those of the first sub-DAC, wherein the output of the second sub-DAC is coupled to a respective one of at least one non-sampling capacitor of each of the plurality of capacitor networks.

14. The method of claim 13, further comprising operating the capacitor network, while in the conversion phase, in a plurality of sub-phases comprising:
  a first conversion sub-phase in which the output of the first sub-DAC is coupled to the plurality of sampling capacitors of the capacitor network, and wherein successive approximation for bits of the first sub-DAC is performed; and
  a second conversion sub-phase in which the output of the second sub-DAC is coupled to the non-sampling capacitor of the capacitor network, and wherein successive approximation for bits of the second sub-DAC is performed.

15. The method of claim 9, further comprising decoupling the capacitor network from the DAC during the sampling phase.

16. The method of claim 9, further comprising coupling the capacitor network to the DAC during the conversion phase.

17. A system comprising:
  an analog front end configured to generate an analog input signal; and
  a successive approximation register analog-to-digital converter (SAR ADC) configured to convert the analog input signal to an equivalent digital signal comprising:
    a capacitor network comprising a plurality of sampling capacitors including at least a first sampling capacitor and a second sampling capacitor for sampling an analog input signal to the SAR ADC and at least one non-sampling capacitor;
    a digital-to-analog converter (DAC);
    an analog comparator configured to compare a sampled analog input signal of the SAR ADC to an output of the DAC; and
    a successive approximation register (SAR) configured to, responsive to an output of the analog comparator, communicate to the DAC successive approximations of a digital code corresponding to the sampled analog input signal;
    wherein the capacitor network is configured to operate in a plurality of phases comprising:
      a sampling phase in which the capacitor network samples the analog input signal using the plurality of sampling capacitors in a plurality of sampling sub-phases comprising:

a first sampling sub-phase in which the first sampling capacitor samples the analog input; and a second sampling sub-phase in which the second sampling capacitor samples the analog input; and a conversion phase in which the first sampling capacitor and the second sampling capacitor are combined and charge shared and in which the particular capacitor network and converts, using successive approximation, a sampled analog input signal sampled during the sampling phase into an equivalent digital output signal.

18. The system of claim 17, wherein a first capacitance of either of the first sampling capacitor and the second sampling capacitor is significantly greater than a second capacitance of the non-sampling capacitor.

19. The system of claim 17, wherein:

the SAR ADC further comprises a plurality of capacitor networks comprising at least the capacitor network and a second capacitor network wherein the second capacitor network comprises a second plurality of sampling capacitors including at least a third sampling capacitor and a fourth sampling capacitor for sampling the analog input signal to the SAR ADC and at least one second non-sampling capacitor; and the second capacitor network is configured to operate in its own respective plurality of phases comprising:

a sampling phase in which the second capacitor network samples the analog input signal using the second plurality of sampling capacitors in a plurality of sampling sub-phases comprising:

a first sampling sub-phase in which the first sampling capacitor of the second capacitor network samples the analog input; and a second sampling sub-phase in which the second sampling capacitor of the second capacitor network samples the analog input; and a conversion phase in which the first sampling capacitor of the second capacitor network and the second sampling capacitor of the second capacitor network are combined and charge shared and in which the second capacitor network converts, using successive approximation, a second sampled analog input signal sampled during the sampling phase into a second equivalent digital output signal.

20. The system of claim 19, wherein the SAR ADC is configured to operate such that the capacitor network is able to operate in the sampling phase of the capacitor network contemporaneously with the second capacitor network operating in the conversion phase of the second capacitor network.

21. The system of claim 17, wherein the DAC comprises a plurality of sub-DACs including at least:

a first sub-DAC representing most significant bits of an output of the SAR ADC, wherein the output of the first sub-DAC is coupled to the plurality of sampling capacitors of each of the plurality of capacitor networks; and a second sub-DAC representing bits of the output of the SAR ADC lesser in magnitude significance than those of the first sub-DAC, wherein the output of the second sub-DAC is coupled to a respective one of at least one non-sampling capacitor of each of the plurality of capacitor networks.

22. The system of claim 21, wherein the capacitor network is configured to operate, while in the conversion phase, in a plurality of sub-phases comprising:

a first conversion sub-phase in which the output of the first sub-DAC is coupled to the plurality of sampling capacitors of the capacitor network, and wherein successive approximation for bits of the first sub-DAC is performed; and a second conversion sub-phase in which the output of the second sub-DAC is coupled to the non-sampling capacitor of the capacitor network, and wherein successive approximation for bits of the second sub-DAC is performed.

23. The system of claim 17, wherein the capacitor network is decoupled from the DAC during the sampling phase.

24. The system of claim 17, wherein the capacitor network is coupled to the DAC during the conversion phase.

* * * * *